(12) United States Patent
Tuominen et al.

(10) Patent No.: US 8,076,586 B2
(45) Date of Patent: Dec. 13, 2011

(54) HEAT CONDUCTION FROM AN EMBEDDED COMPONENT

(75) Inventors: Risto Tuominen, Helsinki (FI); Petteri Palm, Helsinki (FI)

(73) Assignee: Imbera Electronics Oy, Espoo (FI)

( * ) Notice: Subject to any disclaimer, the term of this patent is extended or adjusted under 35 U.S.C. 154(b) by 891 days.

(21) Appl. No.: 11/587,694

(22) PCT Filed: Apr. 27, 2005

(86) PCT No.: PCT/FI2005/000199
§ 371 (c)(1),
(2), (4) Date: Feb. 9, 2007

(87) PCT Pub. No.: WO2005/104635
PCT Pub. Date: Nov. 3, 2005

(65) Prior Publication Data
US 2007/0227761 A1    Oct. 4, 2007

(30) Foreign Application Priority Data

Apr. 27, 2004  (FI) ..................... 20040592

(51) Int. Cl.
*H05K 1/00*    (2006.01)
(52) U.S. Cl. ........ 174/252; 174/262; 174/265; 361/676; 361/701; 361/702; 361/712
(58) Field of Classification Search .............. 174/252, 174/260, 261, 262, 264, 265; 361/676, 678, 361/688, 692, 696, 701, 702, 704, 709, 711, 361/712, 728, 761, 752
See application file for complete search history.

(56) References Cited

U.S. PATENT DOCUMENTS

| | | | |
|---|---|---|---|
| 4,729,061 A | 3/1988 | Brown | |
| 5,942,795 A | 8/1999 | Hoang | |
| 5,991,162 A | 11/1999 | Saso | |
| 6,038,133 A | 3/2000 | Nakatani et al. | |
| 6,353,189 B1 * | 3/2002 | Shimada et al. | 174/255 |
| 6,489,685 B2 | 12/2002 | Asahi et al. | |
| 7,349,225 B1 * | 3/2008 | Bennett | 361/790 |
| 7,449,363 B2 | 11/2008 | Hsu | |
| 2001/0030059 A1 * | 10/2001 | Sugaya et al. | 174/256 |
| 2002/0166688 A1 * | 11/2002 | Smith | 174/52.2 |
| 2003/0128522 A1 | 7/2003 | Takeda et al. | |
| 2003/0141105 A1 | 7/2003 | Sugaya et al. | |
| 2003/0169575 A1 * | 9/2003 | Ikuta et al. | 361/761 |
| 2004/0203552 A1 * | 10/2004 | Horiuchi et al. | 455/333 |
| 2004/0212051 A1 * | 10/2004 | Zhao et al. | 257/672 |
| 2005/0112798 A1 | 5/2005 | Bjorbell | |

(Continued)

FOREIGN PATENT DOCUMENTS

EP    1 111 674 A2    6/2001
(Continued)

*Primary Examiner* — Hoa C Nguyen
(74) *Attorney, Agent, or Firm* — Birch, Stewart, Kolasch & Birch, LLP

(57) ABSTRACT

This publication discloses a circuit-board construction and a method for manufacturing an electronic module, in which method at least one component (6) is embedded inside an insulating-material layer (1) and contacts (14) are made to connect the component (6) electrically to the conductor structures (14, 19) contained in the electronic module. According to the invention, at least one thermal via (22), which boosts the conducting of heat away from the component (6) is manufactured in the insulating-material layer (1) in the vicinity of the component (6).

19 Claims, 6 Drawing Sheets

U.S. PATENT DOCUMENTS

2006/0011383 A1* 1/2006 Noguchi .................. 174/255

FOREIGN PATENT DOCUMENTS

| | | | |
|---|---|---|---|
| EP | 1 225 629 A2 | 7/2002 | |
| EP | 1 304 909 A1 | 4/2003 | |
| WO | WO-85/05496 A1 | 12/1985 | |
| WO | WO-03/065778 A1 | 8/2003 | |
| WO | WO-03/068779 A1 | 8/2003 | |
| WO | WO-2004/001848 A1 | 12/2003 | |
| WO | WO-2004/089048 A1 | 10/2004 | |

* cited by examiner

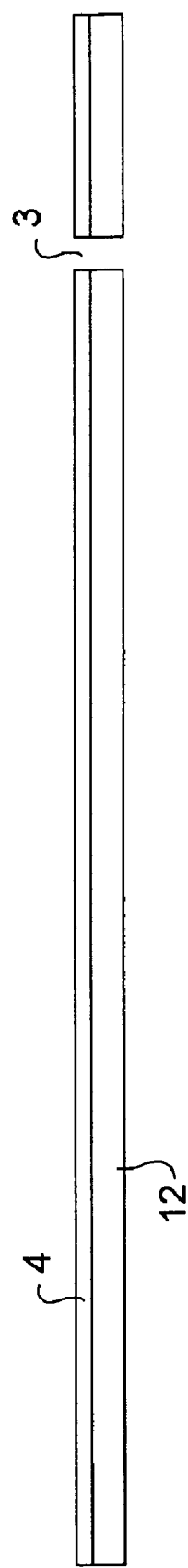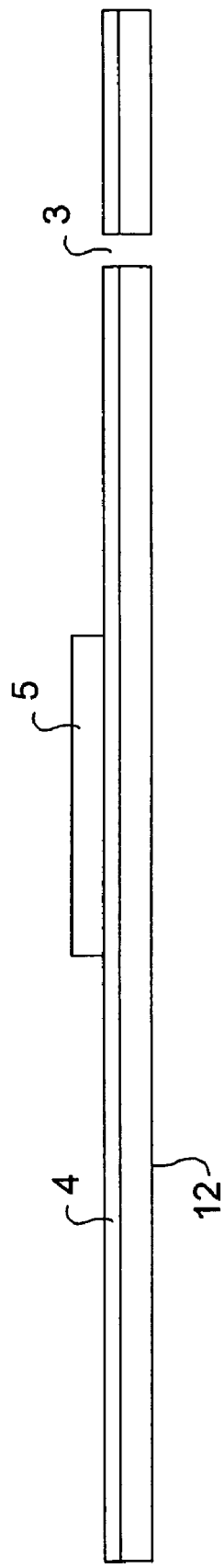

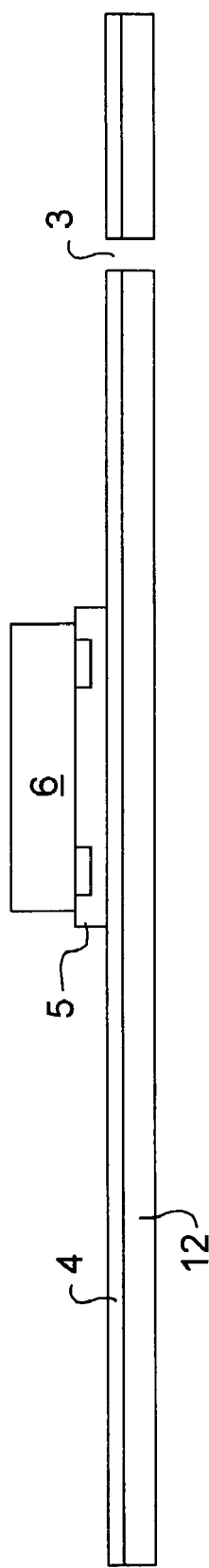
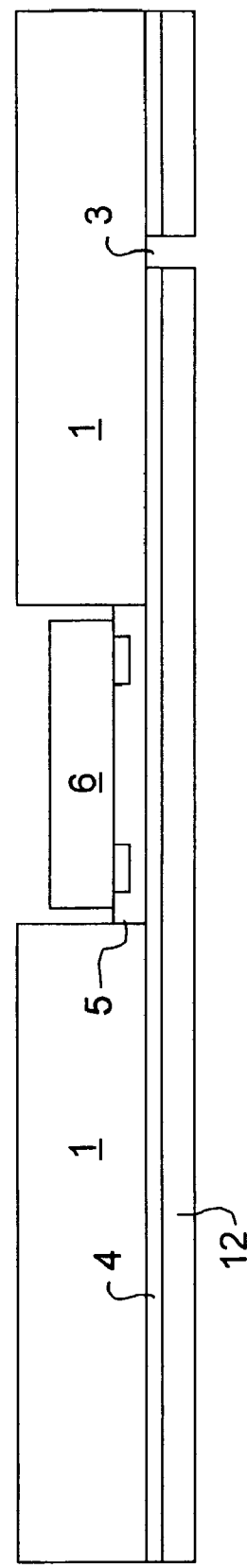

HEAT CONDUCTION FROM AN EMBEDDED COMPONENT

BACKGROUND OF THE INVENTION

The present invention relates to a method for the manufacture of an electronic component and a circuit-board construction.

The invention particularly relates to a manufacturing method, in which one or more components are embedded in an installation base. The electronic module being manufactured can be a module like a circuit board, which contains several components, which are connected to each other electrically through conductor structures manufactured in the electronic module. In particular, the invention relates to an electronic module, which contains microcircuits, to which several contact terminals are connected. Of course, in addition to, or instead of microcircuits, other components too, for example passive components, can be embedded in an installation base. The intention is thus to embed in the electronic module components that are typically attached uncased to a circuit board (to the surface of the circuit board). Another important component group consists of components that are typically encased for attachment to a circuit board. The electronic modules, to which the invention relates, can of course also include other kinds of components.

The installation base can be of a type that is generally used in the electronics industry as a base for installing electrical components. The tasks of the base are to provide a mechanical attachment base for the components as well as the necessary electrical connections, both to the other components on the base and to those outside the base. The installation base can be a circuit board, so that the structure and method to which the invention relates are closely associated with circuit-board manufacturing technology. The installation base can also be some other base, for example, a base used for packaging a component or components, or the base of a complete operational module.

Circuit-board manufacturing technology differs from the manufacture of microcircuits, for instance, in that, in the manufacturing techniques of microcircuits, the installation base, that is a substrate, is a semiconductor material, whereas the basic material of the installation base of circuit boards is some kind of insulation material. The techniques for manufacturing microcircuits are also typically considerably more expensive that those for manufacturing circuit boards.

The casings and packages of components and particularly semiconductor components differ from the construction and manufacture of circuit boards, in that the primary purpose of component packages is to form a casing around the component, which will protect the component mechanically and facilitate the handling of the component. On the surface of the component casing, there are connection parts, typically protrusions, with the aid of which the cased component can be easily correctly aligned on the circuit board and the desired connections created to it. In addition, there are conductors inside the component case, which connect the connection parts protruding outside the case to the connection areas on the surface of the actual component, through which the component can be connected as desired to its surroundings.

However, the cases of components manufactured using this traditional technology demand a considerable amount of space. As the size of electronic devices has diminished, attempts have been made to get rid of component cases, which not only demand much space, but are also unnecessary and lead to needless costs. To solve this problem, various constructions and methods have been developed, with the aid of which components can be located inside the circuit-board structure.

Known methods, in which components are embedded in an installation base during the creation of the base, are disclosed in patent application publication WO 03/065778 and WO 03/065779, as well as in patent publications U.S. Pat. Nos. 6,038,133 and 6,489,685. The methods disclosed in these publications can be used to manufacture, for example, multilayer circuit boards, inside which integrated microcircuits, for example microprocessors and memory circuits, are embedded.

In the known methods, a problem can arise with the heating of the microcircuits inside the installation base. During operation, microcircuits and particularly certain microprocessors produce a significant thermal output, which must be conducted away from the circuit to prevent the circuit from overheating. This is because overheating in a circuit can endanger its reliable operation. When circuits are installed, according to the traditional technique, on the surface of a circuit board, it has been possible to conduct the thermal output to the surrounding air, or attach a suitable heat sink to the circuit. If a circuit is embedded inside a circuit board, the basic material of the circuit-board, which has relatively poor thermal conductivity, will surround the circuit. The thermal output cannot then be easily conducted to the surrounding air, nor is it easy to attach a heat sink to the circuit. The thermal output produced by the circuit will spread from the microcircuit to the surrounding circuit-board material through direct contact and through the buses connected to the circuit.

SUMMARY OF THE INVENTION

The invention is intended to improve the conducting of the thermal output from the embedded components to the surroundings of the installation base.

The invention is based on manufacturing at least one thermal via extending to the vicinity of the component, which will boost the conducting of heat away from the component.

More specifically, the method according to the invention is characterized by what is stated in the characterizing portion of Claim 1.

The circuit-board structure according to the invention is, in turn, characterized by what is stated in Claim 15.

Considerable advantages are gained with the aid of the invention. This is because, with the aid of the invention, it is possible to improve the conducting of the thermal output from a component embedded in an installation base to the surroundings of the installation base. Increased conducting of the thermal output will permit the use of components of greater power than previously inside an electronic-module construction.

Additional advantages are gained by means of embodiments of the invention. These embodiments are described in both the following description and in the dependent Claims.

Advantages relating to manufacturing technology can be obtained in embodiments, in which a thermal via, or thermal vias are manufactured using the same manufacturing technique as the electrical vias, with the aid of which an electrical contact is created between the contact bumps, or other contact areas of a component and the conductor-pattern layer and the conductor-pattern layers of the circuit-board structure. In such an embodiment, the manufacture of the thermal vias will not necessarily require any additional stage in the manufacturing method of an electronic module or other circuit-board construction.

In an embodiment, in which thermal vias are filled with metal with the aid of a chemical and/or electrochemical growing method, the material of the thermal vias is pure metal, so that via will have excellent thermal conductivity. When such a via is manufactured in contact with the surface of the component, excellent thermic contact between the thermal via and the component will also be achieved.

The embodiment permits the thermal vias to be manufactured precisely in the desired locations, for example, precisely in the area of the component in which the component's power consumption is greatest.

With the aid of the embodiments, thermal vias can be manufactured in the direction of both surfaces of the component and even in contact with the side surfaces of the component.

Further, the invention has embodiments that permit suitable dimensions to be selected for a thermal via. The thermal via can have, for example, a very small cross-sectional area, if there is little space for a thermal via. The thermal via can also be large and encompass substantially the entire free surface of the component, in which case the conducting of heat will be very efficient.

In the following, the invention is examined with the aid of examples and with reference to the accompanying drawings.

BRIEF DESCRIPTION OF THE DRAWINGS

FIGS. 1-11 show a series of cross-sections of some examples of the application of the invention, in connection with one manufacturing method.

FIG. 11 shows a cross-section of one electronic module, which includes several installation bases on top of each other, and in which thermal conductors are made around one microcircuit.

DETAILED DESCRIPTION OF EMBODIMENTS OF THE INVENTION

Figure 5:
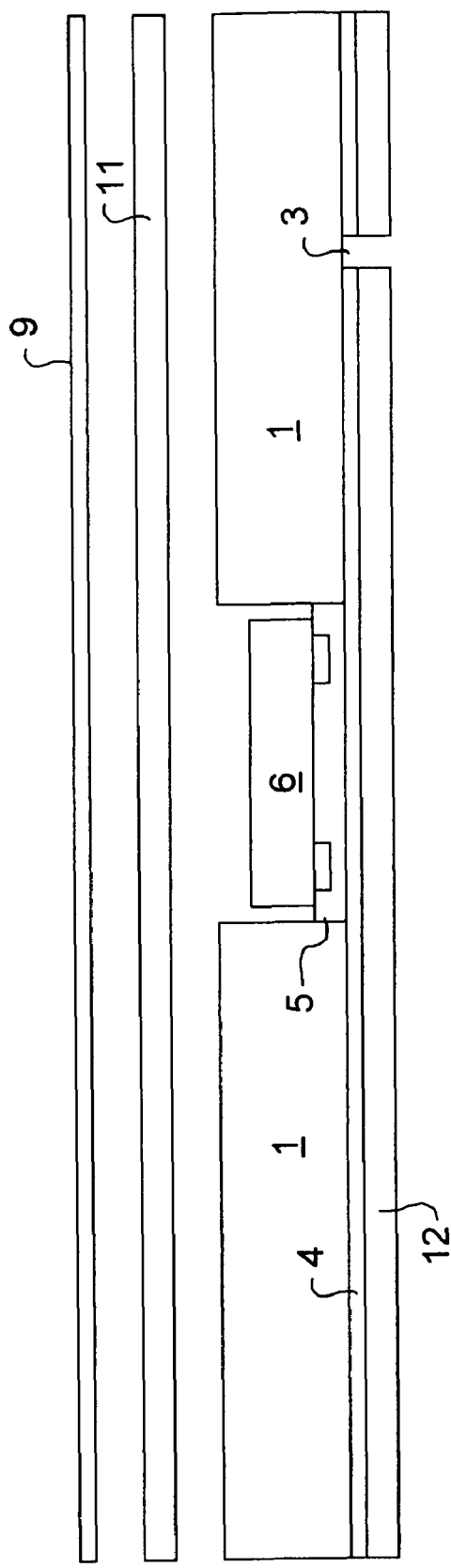

Stage A (FIG. 1):

In stage A, a suitable conductor layer 4 is selected as the starting material for the process. A layered sheet, in which the conductor layer 4 is located on the surface of a support base 12, can also be selected as the starting material. The layered sheet can be manufactured, for example, by taking a support base 12 suitable for processing and attaching a suitable conductor membrane to the surface of this support base 12, for the creation of a conductor layer 4.

The support base 12 can be, for example, of an electrically conductive material, such as aluminium (Al), or of an insulating material, such as a polymer. The conductor layer 4 can be created, for example by attaching thin metal foil to one surface of the support base 12, for example, by laminating it from copper (Cu). The metal foil can be attached to the support base, for example, by using an adhesive layer, which is spread on the surface of the support base 12 or metal foil, prior to the lamination of the metal layer. At this stage, there need be no patterns in the metal foil.

In the example of FIG. 1, holes 3, which penetrate the support base 12 and the conductor layer 4, are made in the base, for alignment during the installation and connection of the components 6. For example, two through-holes 3 can be manufactured for each component 6 to be installed. The holes 3 can be made using some suitable method, for example, mechanically by milling, stamping, drilling, or with the aid of a laser. However, it is not essential to make through-holes 3, instead other suitable alignment markings can also be used to align the components. In the embodiments shown in FIG. 1, the through-holes 3 used to align the components extend through both the support base 12 and the conductor membrane 4. This has the advantage that the same alignment marks (through-holes 3) can be used in aligning on both sides of the installation base.

Stage A can also be performed in the same way in embodiments, in which a self-supporting conductor layer 4 is used and which thus entirely lack the support layer 12.

Stage B (FIG. 2):

In stage B, an adhesive layer 5 is spread on the conductor layer 4, in the areas to which the components 6 are to be attached. These areas can be termed connection areas. The adhesive layers 5 can be aligned, for example, with the aid of through-holes 3. The thickness of the adhesive layer is selected in such a way that the adhesive completely fills the space between the component 6 and the conductor layer 4, when the component 6 is pressed onto the adhesive layer 5. If the component 6 includes contact protrusions 7, the thickness of the adhesive layer 5 should be greater, for example, 1.5-10 times, than the height of the contact protrusions 7, so that the space between the component 6 and the conductor layer 4 will be well filled. The surface area of the adhesive layer 5 formed for the component 6 can also be slightly greater than the corresponding surface area of the component 6, which will also help to reduce the risk of inadequate filling.

The adhesive used in the embodiments is typically a heat-cured epoxy, for example, NCA (non conductive adhesive). The adhesive is selected such that the adhesive used will adhere sufficiently to the conductor membrane, the circuit-board, and the component. One preferred property of the adhesive is a suitable thermal expansion coefficient, so that during the process the thermal expansion of the adhesive will not differ excessively from the thermal expansion of the surrounding material. The adhesive selected should also preferably have a short curing time of at most a few seconds. Within this time, the adhesive should harden at least partly to an extent that will allow the adhesive to hold the component in place. The final hardening can take a clearly longer time and indeed the final curing can be planned to occur in connection with the later process stages. The adhesive should also withstand the process temperatures used, for example, heating to a temperature of 100-265° C. a few times, as well as other stresses, for example, chemical and mechanical stress, in the manufacturing process. The electrical conductivity of the adhesive should preferably be of the same order as that of the insulating materials.

Stage B can be modified in such a way that the adhesive layer 5 is spread on the connector surfaces of the components 6, instead of on the connector areas of the conductor layer 4. This can be performed, for example, in such a way that the component is dipped in adhesive before it is assembled in place in the electronic module. It is also possible to proceed by spreading the adhesive on both the connector areas of the conductor layer 4 and on the connector surfaces of the components 6.

The adhesive used is thus an electrical insulator, so that electrical contacts between the contact areas of the components 6 (for example, the contact protrusions 7) do not arise in the adhesive layer 5 itself.

Stage C (FIG. 3):

In stage C, the components 6 are set in place in the electronic module. This can be done, for example, by using the aid of an assembly machine to press the components 6 into the adhesive layer 5. In the assembly stage, the through-holes 3 made for alignment, or other available alignment marks are used to align the component 6.

The components 6 can be glued singly, or in suitable groups. The typical procedure is for the conductor layer, which can be referred to as the bottom of the installation base, to be brought to a suitable position relative to the assembly machine, after which the component 6 is aligned and pressed onto the bottom of the installation base, which is held stationary during alignment and attachment.

Stage D (FIG. 4):

In stage D, an insulating-material layer 1, in which there are ready made holes 2 or recesses for the components 6 glued to the conductor layer 4, is placed on top of the conductor layer 4. The insulating-material layer 1 can be manufactured from a suitable polymer base, in which holes or recesses, selected according to the size and position of the components 6, are manufactured using some suitable method. The polymer base can be, for example, a pre-preg base, which is known and widely used in the circuit-board industry, which is made from a glass-fibre mat and so-called b-state epoxy. It is best to perform stage D only after the adhesive layer 5 has been cured, or otherwise hardened sufficiently for the components 6 to remain in place while the insulating-material layer 1 is set in place.

When manufacturing very simple electronic modules, the insulating-material layer 1 can be attached to the conductor layer 4 in connection with stage D and the process continued with the patterning of the conductor layer 4.

Stage E (FIG. 5):

In stage E, an unpatterned insulating-material layer 11 is set on top of the insulating-material layer 1 and then a conductor layer 9 is set on top of it. Like the insulating-material layer 1, the insulating-material layer 11 can be manufactured from a suitable polymer membrane, for example, from the aforementioned pre-preg base. The conductor layer 9 can be, for example, copper foil, or some other membrane suitable for the purpose.

Figure 6:
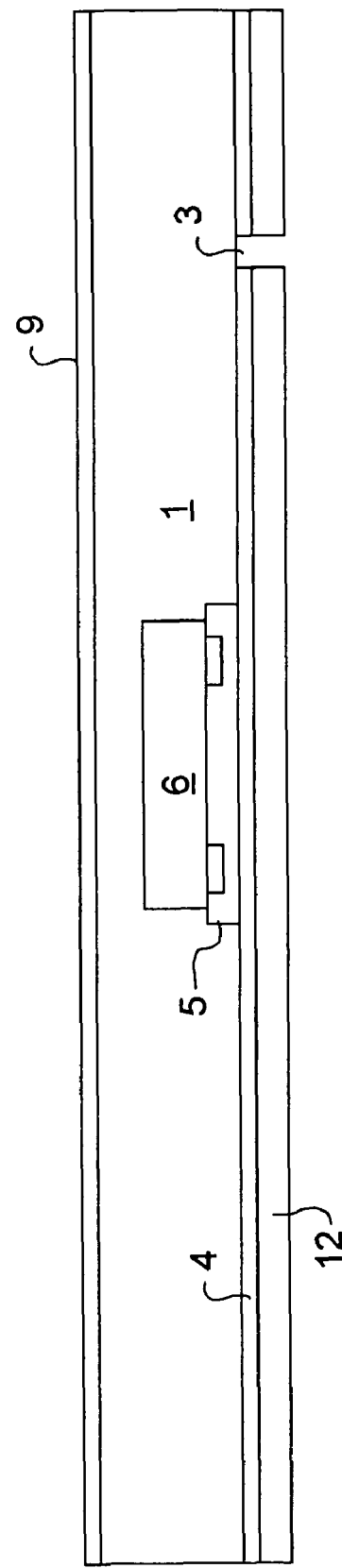

Stage F (FIG. 6):

In stage F, the layers 1, 11, and 9 are pressed with the aid of heat and pressure, in such a way that the polymer (in the layers 1 and 11) forms a unified and tight layer around the components 6 between the conductor layers 4 and 9. This procedure makes the second conductor layer 9 quite even and flat.

When manufacturing simple electronic modules including a single conductor pattern layer 14, stage E can even be entirely omitted, or the layers 1 and 11 can be laminated to the structure without the conductor layer 9.

Figure 7:
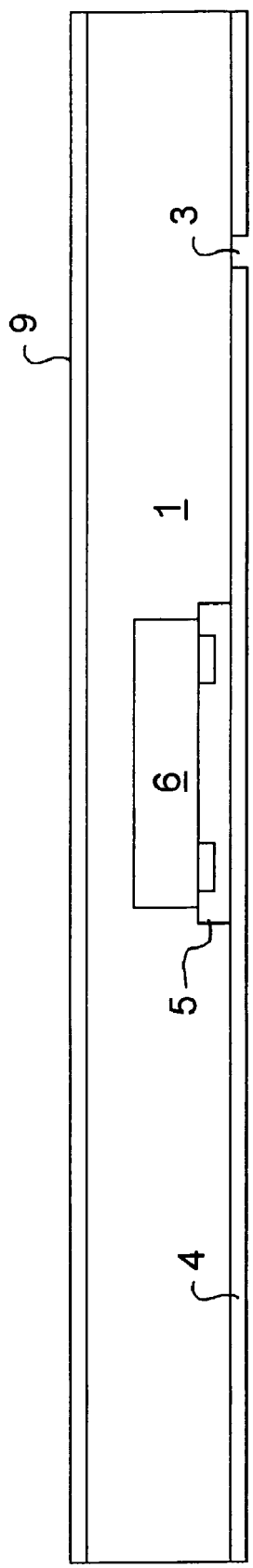

Stage G (FIG. 7):

In stage G, the support base 12 is detached or otherwise removed from the structure. The removal can take place, for example, mechanically or by etching. Naturally, stage G can be omitted in embodiments in which a support base 12 is not used.

Figure 8:
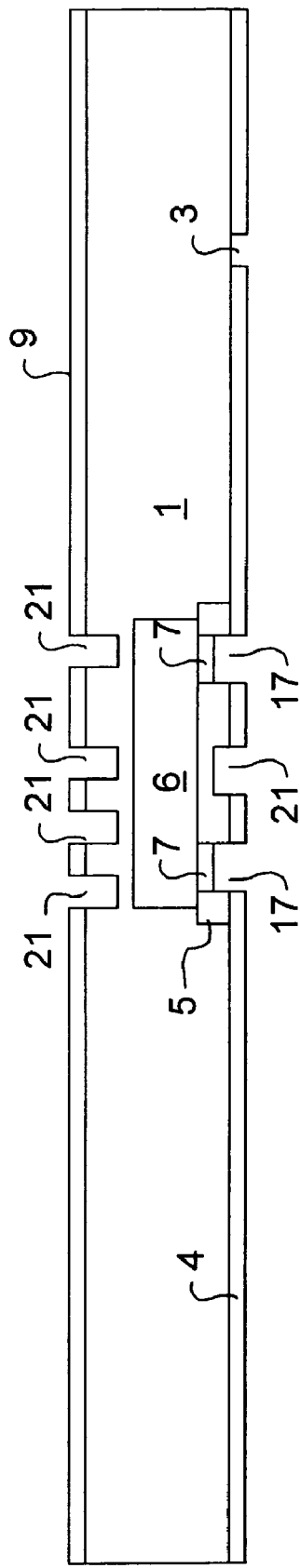

Stage H (FIG. 8):

In stage H, holes 17 are made for the vias. The holes 17 are made through the conductor layer 4 and the adhesive layer 5, in such a way as to reveal the material of the contact protrusions 7 or corresponding contact areas of the components 6. The holes 17 can be made, for example, by drilling with the aid of a laser. The holes 17 can be aligned, for example, with the aid of the holes 3.

At the same time, holes 21 are also made for the thermal vias belonging to the thermal conductors. The holes 21 are made in the same way as the holes 17. If the component 6 includes contact bumps protruding from its surface, the depth of the holes 21 can correspond to the depth of the holes 17, so that both holes can be made, for example, by applying exactly the same laser-drilling parameters. The depth of the holes on the opposite side of the component is, of course, determined by the thickness of the insulating layer on that side. The intention is to make the holes 21 in such a way that a small amount of insulating material remains between the bottom of the hole 21 and the component 6, so that an electrical contact will not be formed between the thermal via and the surface of the component. A suitable distance can be, for example, 1-15 micrometers.

In some embodiments, the thermal vias can also be made up to the surface of the component. In that case, the hole 21 too extends to the component. In such embodiments, care must be taken that the semiconductor material of the component is not connected to the wrong potential through the thermal via.

If thermal bumps, which are intended to conduct the heat away from the component, have been made on the surface of the component, the holes 21 should be attempted to be made at least at the position of such thermal bumps. In that case, the holes 21 can extend to the surface of the thermal bump.

In general, the number, cross-sectional area, and location of the thermal vias are chosen according to the heat-transfer requirement and taking into account that the thermal conductors must not interfere unnecessarily with the electrical operation of the component. However, it is preferable to locate the thermal vias at, or immediately next to the component.

In some embodiments, the thermal vias are used to form a ground contact between the component and the ground reference plane. In that case, the ground contact of the component is made with a considerably larger cross-sectional area than normal, or the ground contact is formed from several separate ground contacts, the combined cross-sectional area of which is considerable greater than that of a conventional ground contact.

Figure 9:
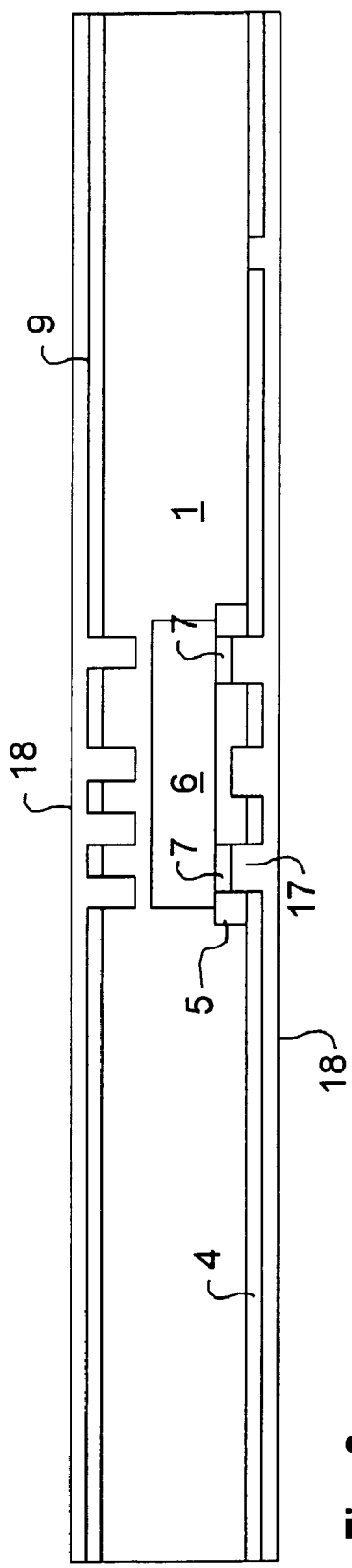

Stage I (FIG. 9):

In stage I, conductor material 18 is grown in the holes 17 and 21 made in stage H. In the example process, the conductor material is grown at the same time also elsewhere on top of the base, thus increasing the thickness of the insulating layers 4 and 9 too.

The conductor material 18 to be grown can be, for example, copper, or some other sufficiently electrically conductive material. The selection of the conductor material 18 takes into account the ability of the material to form an electrical contact with the material of the contact protrusions 7 of the component 6. In one example process, the conductor material 18 is mainly copper. The copper metallizing can be performed by depositing a thin layer of chemical copper in the holes and then continuing plating using an electrochemical copper-growing method. Chemical copper is used in the example because it will also form a deposit on top of the adhesive and act as an electrical conductor in electrochemical plating. The metal can thus be grown using a wet-chemical method, so that the growing is cheap.

In the example process, the vias 17 are first of all cleaned using a three-stage desmear process. After this, the vias are metallized, in such a way that first a polymer catalyzing SnPd coating is formed, after which a thin layer (about 2 μm) of chemical copper is deposited on the surface. The thickness of the copper is increased by electrochemical deposition.

Stage I is intended to form an electrical contact between the component 6 and the conductor layer 4 and to fill the holes 21 with a thermally highly conductive material. Thus, in stage I it is not essential to increase the thickness of the conductor layers 4 and 9, but instead the process can equally well be designed so that in stage I the holes 17 and 21 are only filled with a suitable material. The conductor layer 18 can be manufactured, for example, by filling the holes 17 with an electrically conductive paste, or by using some other suitable microvia metallizing method. In the case of the holes 21, the filling material must conduct heat better than the base material of the circuit board 1.

In the later figures, the conductor layer 18 is shown merged with the conductor layers 4 and 9.

Figure 10:
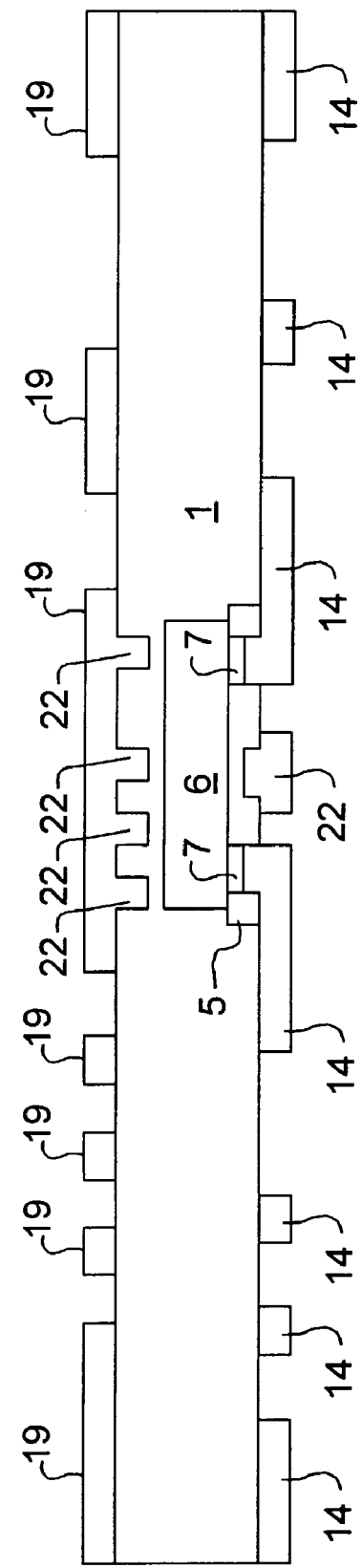

Stage J (FIG. 10):

In stage J, the desired conductor patterns 14 and 19 are made from the conductor layers 4 and 9 on the surfaces of the base. If in the embodiment only the conductor layer 4 is used, the patterns are formed only on one side of the base. It is also possible to proceed by forming conductor patterns only from the conductor layer 4, even though a second conductor layer 9 is used in the embodiment. In such an embodiment, the unpatterned conductor layer 9 can act, for example, as a layer that supports or protects the electronic module mechanically, as protection against electromagnetic radiation, or as a surface that conducts thermal output outside the module and releases it.

The conductor patterns 14 can be made by removing the conductor material of the conductor layer 4 from outside the conductor patterns. The conductor material can be removed, for example, using some of the patterning and etching methods that are widely used and well known in the circuit-board industry.

After stage J, the electronics module includes a component 6, or several components 6, as well as conductor patterns 14 and 19 (in some embodiments, only the conductor patterns 14), with the aid of which the component 6, or components can be connected to an external circuit, or to each other. In addition, the electronic module includes one or several thermal vias 22, which extend to the surface of the component 6, or the thermal bump, or to the vicinity of the surface. The preconditions then exist for manufacturing an operational totality. The process can thus be designed in such a way that the electronic module is ready after stage J and FIG. 10 indeed shows an example of one possible electronic module. If desired, the process can also be continued after stage J, for example, by coating the electronic module with a protective agent, or by manufacturing additional conductor pattern layers on the first and/or second surface of the electronic module.

FIG. 11

Figure 11:
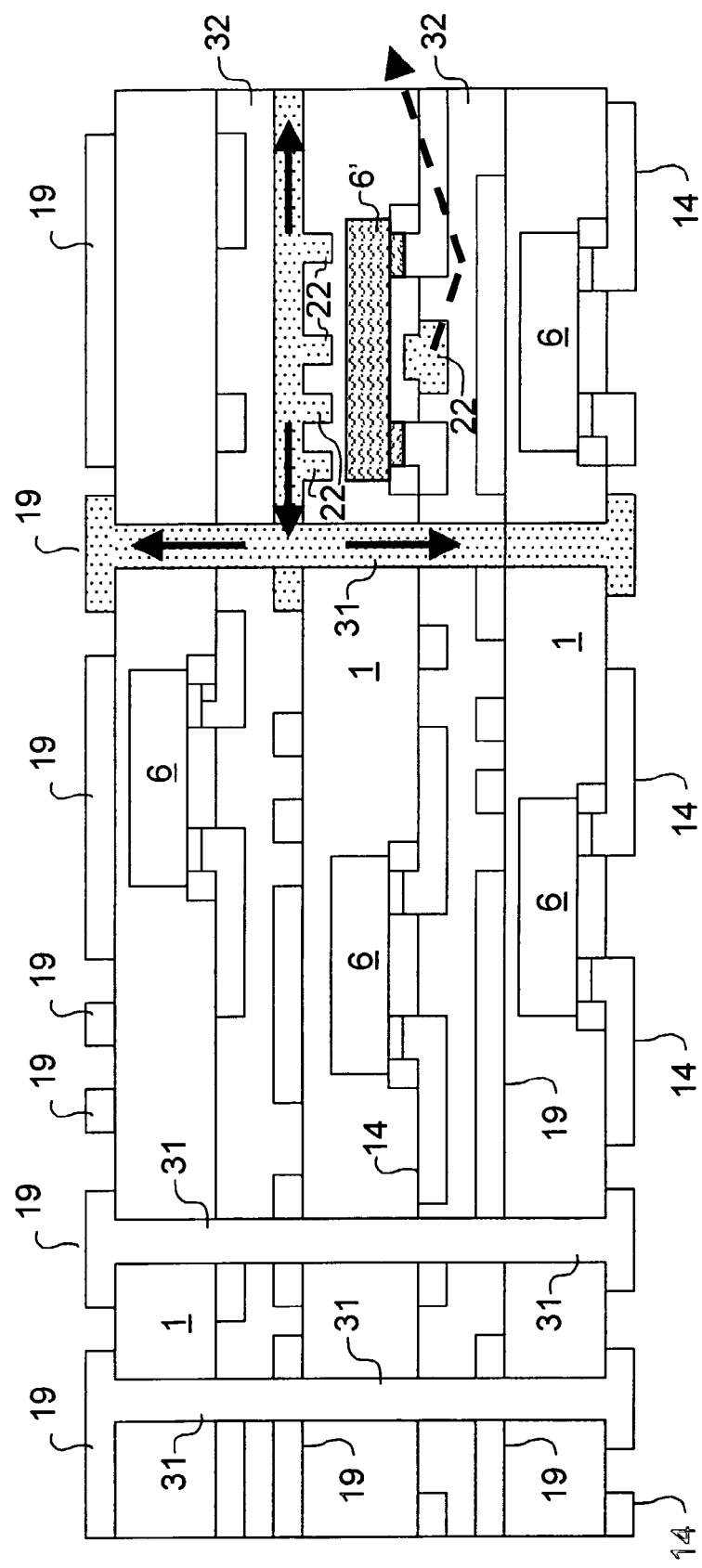

FIG. 11 shows a multi-layer electronic module, which contains three bases 1 laminated on top of each other, together with components 6 and a total of six conductor pattern layers 14 and 19. The bases 1 are attached to each other with the aid of intermediate layers 32. The intermediate layer 32 can be, for example, a pre-preg-epoxy layer, which is laminated between the bases 1. After this, holes penetrating the module, for the formation of contacts, are drilled in the electronic module. The contacts are formed with the aid of a conductor layer 31 grown in the holes. With the aid of the conductors 31 running through the electronic module, the conductor pattern layers 14 and 19 of the various bases 1 can be suitably connected to each other and thus create a multi-layered operational totality. In addition, the conductors 31 can be used to conduct heat in the vertical direction of the electronic module.

In the example of FIG. 11, the power consumption of the component 6' is greater than that of the other components and the faultless operation of the component 6' requires boosted conduction of the thermal output from the component 6' to outside the electronic module. In order to conduct the thermal output, thermal vias 22 are manufactured in the aforementioned manner, in the vicinity of the component 6'. The vias 22 located in the position shown above the component 6' extend to close to the surface of the component 6' and boost the transfer of heat between the component 6' and the conductor layer located above it. In the figure, the direction of the heat conducting is shown by arrows. The conductor layer acts as a thermal conductor in the lateral direction of the electronic module. In addition, the conductor layer is connected to the vertical thermal conductor 19, with the aid of which the thermal output can be conducted from the innermost layers of the electronic module to the surface of the electronic module. For their part, the thermal conductors extending to the surface of the electronic module can be connected to a suitable heat sink, thus further boosting the cooling of the component 6'.

In the position shown in the figure, the via 22 located below the component 6' also extends to close to the surface of the component 6' and boosts the transfer of heat from the lower surface of the component 6' to the surrounding structures. In this example, the via 22 extends, in the lateral direction of the electronic module, in a direction at right angles to the surface of the figure and conducts heat in the lateral direction away from the vicinity of the component 6'. This heat conducting is shown in the figure by a broken-line arrow.

In the example of FIG. 11, the thermal conductors are manufactured around only a single component. The thermal conductors can, however, be manufactured in a completely similar manner around any other component whatever, but in the example of FIG. 11 the other components are imagined to be circuits with a lower power consumption, for which boosted conducting of the thermal output is not essential. If the construction of the electronic module in the surroundings of such a low-power component 6 is compared with that in the surroundings of the high-power component 6', it will be observed that, around the high-power component 6', the electronic module includes additional structures emphasized by a pattern of dots. The purpose of these emphasized structures is to boost the conducting of heat away from the component 6'. The electronic module shown in FIG. 11 differs from known electronic modules precisely due to these additional structures. Thus, the electronic module includes conductor structures in the surroundings of the embedded component 6' that are not essential in order to create the electrical connections of the electronic module and which increase the ability of the electronic module to conduct heat away from the component 6'. In this example, these thermal conductors are in no way connected electrically to the component 6'. In some other embodiments, the thermal conductors, or at least some of them, could, for their part, form, for example, the ground contact of the component 6'.

Sub-modules of the multi-layer electronic module (the bases 1 with their components 6 and conductors 14 and 19) can be manufactured, for example, using one of the electronic-module manufacturing methods described above. Some, or all of the sub-modules to be attached to the layered structure can, of course, be manufactured quite as well using some other method suitable for the purpose.

The examples of FIGS. 1-11 show some possible processes, with the aid of which our invention can be exploited. However, our invention is not restricted only to the processes described above, but instead the invention also covers other various processes and their end products, taking into account the full scope and equivalence interpretation of the Claims. The invention is also not restricted to only the constructions and methods shown by the examples, but instead it will be obvious to one versed in the art that the various applications of our invention can be used to manufacture very many different kinds of electronic modules and circuit-boards, which differ even greatly from the examples described above. The components and circuits of the figures are thus shown only for the purpose of illustrating the manufacturing process. Thus many alterations can be made to the processes of the examples described above, without, however, deviating from the basic idea according to the invention. The changes can relate, for example, to the manufacturing techniques described in the different stages, or to the mutual order of the process stages.

The invention can thus also be applied when embedding components in an installation base using other techniques. For example, in connection with the method disclosed in the publication WO 03/065778, the thermal vias could be manufactured in the module as surplus holes 12 in stage K (FIG. 1K). In the method of publication WO 03/065779, in turn, surplus holes 13 could be manufactured in stage K (FIG. 1K). The method disclosed in U.S. Pat. No. 6,489,685 could, on the other hand, be modified, for example, in such a way that (references to the examples of FIG. 2) the thickness of the insulating layer 201 would be increased and vias 204 would also be made at the location of the component 203. Alternatively, the thermal vias could be made after the stage shown by FIG. 2G, according to the example described above that exploits laser drilling.

In the embodiment shown in FIG. 2 of U.S. Pat. No. 6,038,133, thermal vias could be made, for example, in such a way that thermal bumps are made in the lower surface of the copper foil 206, which are positioned at the location of the component 204 and which press, in stage g, close to the surface of the component. In the embodiment of FIG. 3 of the same patent, thermal vias could be manufactured, for example, in such a way that an additional conductor area 303 is made on the film 305 between the conductor areas forming a contact to the component. In a corresponding manner, additional conductor areas 306 could be manufactured in the membrane 307, even though in reality these additional conductor areas 306 would, particularly above the component, come to be situated excessively far from the surface of the component. To significantly increase the thermal conduction, it should be possible to make these additional conductor areas 303 and 306 higher than the thickness of the actual conductors 303 and 306. The thermal conductors would then be brought closer to the surface of the component.

It is thus possible to also apply our invention in connection with many different kinds of known methods and electronic modules. In addition, the invention can also be applied in connection with the method and electronic modules disclosed in the same applicant's international patent applications, which are still unpublished at the moment of making the present application. For example, in the method disclosed in application PCT/FI2004/000195, the invention can be applied in the manner shown in the series of figures shown above.

In the method disclosed in application PCT/FI2004/000101, thermal bumps manufactured in the areas between the contact areas of the component. From the other direction, thermal vias could be made, for example, by the method exploiting laser drilling shown in the series of figures shown above. Thermal vias above the component can also be made by pressing conductor balls, or other particles that improve thermal conductivity into the filler substance 8, before the filler 8 hardens. It is also possible to proceed similarly in connection with the technique disclosed in application PCT/FI2004/000102.

With the aid of the methods described above and variations of them, it is thus possible to manufacture a circuit-board construction, which includes an insulating-material layer 1 and at least two conductor pattern layers 14, 19, which are typically on opposite sides of the insulating-material layer 1. In addition, the circuit-board construction includes inside the insulating-material layer 1, at least one component 6 and contacts 14, with the aid of which the component 6 is connected electrically to at least one of the conductor pattern layer 14, 19. In addition, the circuit-board construction includes at least one thermal via 22, which is a structural component boosting thermal conduction and extending in the insulating layer 1, which is located in the vicinity of the component 6. The actual component can be, for example, an uncased semiconductor chip.

In one embodiment, the circuit-board construction includes a thermal via, or thermal vias on the side of both the first and second surface of the insulating-material layer 1. These thermal vias on both sides can also be manufactured using the same method and even in the same process stage. The circuit-board construction can thus include thermal vias 22, which have the same construction, on both sides of the component 6. The thermal vias 22 can also have the same construction to the vias made for the electrical contacts of the component. Like the electrical contacts, the thermal vias can also be manufactured in such a way that they are connected to the conductor pattern layers 14, 19, so that the conducting of heat away from the vicinity of the component becomes more efficient.

In one embodiment, the thermal via 22 consists of pure, uniform metal. This metal is usually copper and it can be manufactured, for example, using a chemical and/or electrochemical deposition method.

The thermal via 22 can be in contact with the surface of the component 6, in which case the conducting of the heat will be efficient. A very effective contact will be obtained, if there is a metallurgical contact between the via and the component. This will also permit an electrical contact to be created through the thermal via 22, for example, to connect the ground potential to the component.

The number, location, and cross-sectional areas of the thermal vias are selected according to the application. Factors to be taken into account include a sufficient thermal conduction capacity and efficient use of space, when the available space is divided effectively between the electrical conductors and the thermal conductors. The methods described above permit the thermal vias to be precisely positioned in the desired areas, as well as a very free choice of the dimensions of the vias.

In the following are descriptions of examples of some possible dimensions of thermal vias. On the surface of the component 6, there are both contact areas, which are intended for the creation of electrical contacts, and the surface outside them. In the following, this surface outside the contact areas is referred to as the free surface. Further, for the examination the free surface is defined to include the surface area on the first surface of the component and on the second surface opposite to this, as well as on the edge surfaces, which connect the first and second surfaces to each other. The term first surface thus refers to the surface of the component, on which most of the contact areas are located. In the circuit-board construction, the thermal vias 22 are typically designed on the free surface and, in many embodiments, in such a way that they come into contact with the free surface of the component on the first surface, the second surface, and/or the area of the edge surface.

In an embodiment forming such a contact, the common contact surface area of the thermal via 22 and the component with the second surface can be, for example, at least 50%, when a good thermal conduction capacity will already be achieved. If a very effective thermal conduction capacity is necessary, the common contact surface can be at least 70% and preferably even at least 90% of the surface area of the second surface.

When examining the free surface of the entire component, it is possible, for example, to aim for a common contact surface area between the thermal vias 22 and the component 6 of at least 15% and preferably at least 30% of the surface area of the free surface. In embodiments requiring a very large thermal conduction capacity, the common contact surface area can even be more than 60% of the surface area of the free surface.

As an example of the cross-sectional area of the individual thermal vias 22, it can be stated that the cross-sectional area of a thermal via should preferably be designed to be at least 30 $\mu m^2$, if the space available in the circuit-board construction will only permit this.

The invention claimed is:

1. A circuit-board construction, comprising:
    an insulating-material layer;
    at least two conductor pattern layers;
    at least one component inside the insulating-material layer;
    electrical vias to connect the component electrically to at least one of the conductor pattern layers; and
    at least one thermal via in the insulating-material layer in the vicinity of the component, wherein
    at least one electrical via connected to said component and at least one thermal via in the vicinity of said component are situated on a first surface of the insulating-material and are formed from the same solderless material,
    at least one of the conductor pattern layers is situated on the side of the first surface of the insulating-material layer and at least one other of the conductor pattern layers is situated on the side of a second surface, opposite to the first surface, of the insulating-material layer, and
    at least one thermal via is connected to the conductor pattern layer on the side of the first surface and at least one other thermal via is connected to the conductor pattern layer on the side of the second surface.

2. A circuit-board construction according to claim 1, wherein both the thermal via connected to the conductor pattern layer on the side of the first surface and the thermal via connected to the conductor pattern layer on the side of the second surface have a similar construction.

3. A circuit-board construction according to claim 1, wherein the thermal via consists of pure, uniform metal.

4. A circuit-board construction according to claim 3, wherein the construction of the thermal vias is similar to that of the electrical vias that connect the electrical contact areas of the component to at least one of the conductor pattern layers.

5. A circuit-board construction according to claim 3, wherein the metal is copper.

6. A circuit-board construction according to claim 1, wherein
    the thermal via includes a metal material, and
    the thermal via is manufactured by a chemical and/or electrochemical deposition method.

7. A circuit-board construction according to claim 6, wherein the metal is copper.

8. A circuit-board construction according to claim 1, wherein the material of the thermal via is in metallurgical contact with the surface of the component.

9. A circuit-board construction according to claim 1, in which at least one thermal via forms an electrical contact with the component, in order to conduct the ground potential to the component.

10. A circuit-board construction according to claim 1, wherein there are contact areas on the surface of the component for the creation of electrical contacts, as well as a free surface outside the contact areas, which free surface includes a surface area on the first surface of the component and on the second surface opposite to the first surface, as well as on the edge surfaces that connect the first and second surfaces to each other, and in which circuit-board construction at least one thermal via comes into contact with the free surface of the component.

11. A circuit-board construction according to claim 10, wherein at least one thermal via comes into contact with the free surface, in the area of the edge surface.

12. A circuit-board construction according to claim 10, wherein at least one thermal via comes into contact with the free surface, in the area of the first surface.

13. A circuit-board construction according to claim 10, wherein at least one thermal via comes into contact with the free surface, in the area of the second surface.

14. A circuit-board construction according to claim 13, wherein the combined contact surface area of one or more thermal vias with the second surface is at least 50% of the surface area of the second surface.

15. A circuit-board construction according to claim 10, wherein the common contact surface area between the thermal vias and the component is at least 15% of the surface area of the free surface.

16. A circuit-board construction according to claim 1, wherein the cross-sectional area of at least one thermal via is at least 30 $\mu m$.

17. A circuit-board construction according to claim 1, wherein the component is an uncased semiconductor chip.

18. A circuit-board construction according to claim 1, wherein the thermal via and the at least one electrical via are both manufactured by a chemical and/or electrochemical deposition method.

19. A circuit-board construction according to claim 1, wherein
    the component includes a contact bump, and
    the at least one electrical via is connected to said contact bump of the component.

* * * * *